(12) United States Patent
Yu et al.

(10) Patent No.: US 8,249,840 B2
(45) Date of Patent: Aug. 21, 2012

(54) DIVERSITY AND DEFENSE-IN-DEPTH SIMULATION APPARATUS

(75) Inventors: Yuan-Chang Yu, Longtan Shiang (TW); Mao-Sheng Tseng, Longtan Shiang (TW); Hui-Wen Huang, Longtan Shiang (TW); Tsung-Chieh Cheng, Longtan Shiang (TW)

(73) Assignee: Atomic Energy Council—Institute of Nuclear Energy Research, Lungtan, Taoyuan (TW)

( * ) Notice: Subject to any disclaimer, the term of this patent is extended or adjusted under 35 U.S.C. 154(b) by 517 days.

(21) Appl. No.: 12/556,227

(22) Filed: Sep. 9, 2009

(65) Prior Publication Data
US 2011/0060582 A1    Mar. 10, 2011

(51) Int. Cl.
    *G06G 7/48* (2006.01)
(52) U.S. Cl. ............................................ 703/6; 376/207
(58) Field of Classification Search ...... 703/6; 376/215, 376/217, 207; 382/216; 702/185, 292; 370/241
    See application file for complete search history.

(56) References Cited

U.S. PATENT DOCUMENTS

| | | | | |
|---|---|---|---|---|
| 7,539,597 | B2* | 5/2009 | Wegerich et al. | 702/185 |
| 2003/0002612 | A1* | 1/2003 | Menard | 376/215 |
| 2006/0291399 | A1* | 12/2006 | Mathena et al. | 370/241 |
| 2009/0106001 | A1* | 4/2009 | Yu et al. | 703/6 |
| 2009/0297042 | A1* | 12/2009 | Nair et al. | 382/216 |
| 2010/0080334 | A1* | 4/2010 | Sohn et al. | 376/217 |
| 2010/0100251 | A1* | 4/2010 | Chao et al. | 700/292 |

OTHER PUBLICATIONS

Titus, "The PXI bus hits its stride", Electronic component news, Dec. 18, 2008.*

* cited by examiner

*Primary Examiner* — Kandasamy Thangavelu
(74) *Attorney, Agent, or Firm* — Jackson IPG PLLC

(57) ABSTRACT

A simulator system transfers parameters between an enhanced nuclear power plant simulator and a safety control system simulator. Problems concerning software common mode failure, interface interactions errors, software failure complexity, and other failure modes, are evaluated. Thus, diversity and defense-in-depth are analyzed and safety is improved.

18 Claims, 6 Drawing Sheets

DIVERSITY AND DEFENSE-IN-DEPTH SIMULATION APPARATUS

FIELD OF THE INVENTION

The present invention relates to analysis of diversity and defense-in-depth; more particularly, relates to evaluating problems in a digital instrument and control system for diversity and defense-in-depth analysis, including software common mode failure, interaction errors between an operator and an interface of the digital instrument and control system and complexity of a software fault.

DESCRIPTION OF THE RELATED ARTS

Single failure criterion for safety of a nuclear power plant requires that any single failure in a safety system does not make the whole safety system stop running. Hence, redundant facilities are usually set at critical points to conform to the single failure criterion. In other words, when a facility fails, another facility of the like is turned on to prevent impaired safety of the nuclear power plant.

A digital instrument and control system is driven by software, which is different from mechanisms of software faults and failures of the digital instrument and control system. Although traditional redundant facilities may reduce impact of hardware failures, software common mode failure of the digital instrument and control system would destroy the defense mechanism of the redundant facilities. Hence, if common mode failure happens, the redundant facilities may fail to function. Since the digital instrument and control system is driven by software, a serious situation may result owing to the malfunction of the digital instrument and control system once the common mode failure happens.

As is obvious to modern life, the digital instrument and control system is widely used, where its functions are powerful and its interfaces are user friendly with abundant information provided. However, some critical issues may defeat the safety system and increase difficulties in diversity and defense-in-depth analysis, like software common mode failure of the digital instrument and control system, interaction errors between an operator and an interface of the digital instrument and control system and complexity of a software fault. Among them, the interaction errors between the operator and the interface of the digital instrument and control system are most crucial. Yet, solutions for the crucial issue are still not ideal. Hence, the prior arts do not fulfill all users' requests on actual use.

SUMMARY OF THE INVENTION

The main purpose of the present invention is to provide a simulation platform for evaluating problems in a digital instrument and control system for the diversity and defense-in-depth analysis, including software common mode failure, interaction errors between an operator and an interface of the digital instrument and control system and complexity of a software fault.

The second purpose of the present invention is to estimate possible interaction errors between an operator and an interface of the digital instrument and control system to find new fault modes and to deduce scenarios for finding weakness of a safety control system and evaluating a design of a diversity and defense-in-depth system to improve safety of a nuclear power plant To achieve the above purposes, the present invention is a diversity and defense-in-depth simulation apparatus, comprising: (a) a safety control system simulator, comprising: (a1) a hardware architecture being an industrial personal computer in a cabinet of the safety control system simulator and having a first hardware input/output (I/O) interface; (a2) a software architecture, comprising: (a21) a first user interface layer; (a22) a core model of said safety control system simulator; (a23) a first hardware I/O data processing module; (a24) a first operating system; and (a25) a Peripheral Component Interconnect (PCI) eXtensions for Instrumentation (PXI) hardware I/O interface layer; and (a3) a kernel architecture, comprising: (a31) a program workflow control module; (a32) an external interface processing module; and (a33) a safety control system module; and (b) an enhanced nuclear power plant simulator, comprising: (b1) a hardware architecture being an industrial personal computer in a cabinet of the enhanced nuclear power plant simulator and having a second hardware I/O interface; (b2) a software architecture, comprising: (b21) a second user interface layer; (b22) an enhanced nuclear power plant simulation module; (b23) a second hardware I/O data processing module; (b24) a second operating system; and (b25) a hardware I/O interface layer; and (b3) a kernel architecture, comprising: (b31) a system calculation module; and (b32) a nuclear power plant simulation calculation module, where parameters of the enhanced nuclear power plant simulator and control responses of the safety control system simulator are mutually transferred through hard-wired connections at backplanes. Accordingly, a novel diversity and defense-in-depth simulation apparatus is obtained.

BRIEF DESCRIPTION OF THE DRAWINGS

The present invention will be better understood from the following detailed description of the preferred embodiment according to the present invention, taken in conjunction with the accompanying drawings, in which.

DESCRIPTION OF THE PREFERRED EMBODIMENT

The following description of the preferred embodiment is provided to understand the features and the structures of the present invention.

Figure 1:
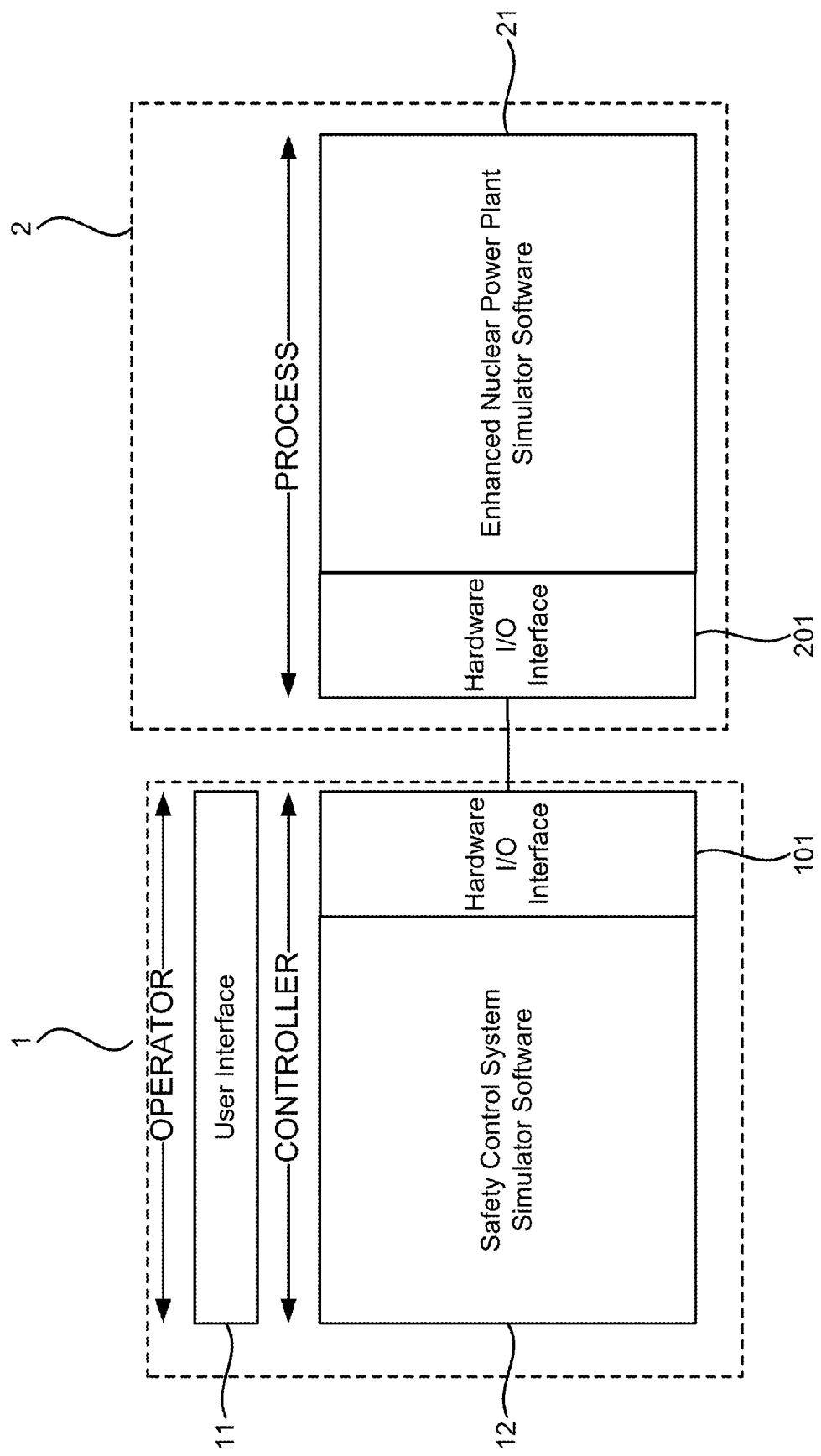
FIG. 1 is a structural view showing the preferred embodiment according to the present invention.

Please refer to FIG. 1, which is a structural view showing a preferred embodiment according to the present invention. As shown in the figure, the present invention is a diversity and defense-in-depth simulation apparatus, comprising a safety control system simulator 1 and an enhanced nuclear power plant simulator 2.

The safety control system simulator 1 comprises a user interface 11 and a safety control system simulator software 12. Therein, the user interface 11 is used for operating a simulated safety system manually and for showing information. The safety control system simulator software 12 simulates behaviors of a safety control system, where parameters of the enhanced nuclear power plant simulator 2 are received through a first hardware input/output (I/O) interface 101 of the safety control system simulator 1; and the safety control system simulator software 12 generated commands are transferred through the first hardware I/O interface 101 to control the enhanced nuclear power plant simulator 2 according to control logics of the safety control system simulator 1.

The enhanced nuclear power plant simulator 2 is based on an enhanced nuclear power plant simulator software 21, which receives commands through a second hardware I/O interface 201 to control the enhanced nuclear power plant simulator 2 and feeds back reactions of a simulated enhanced nuclear power plant for a diversity and defense-in-depth analysis.

Figure 2:
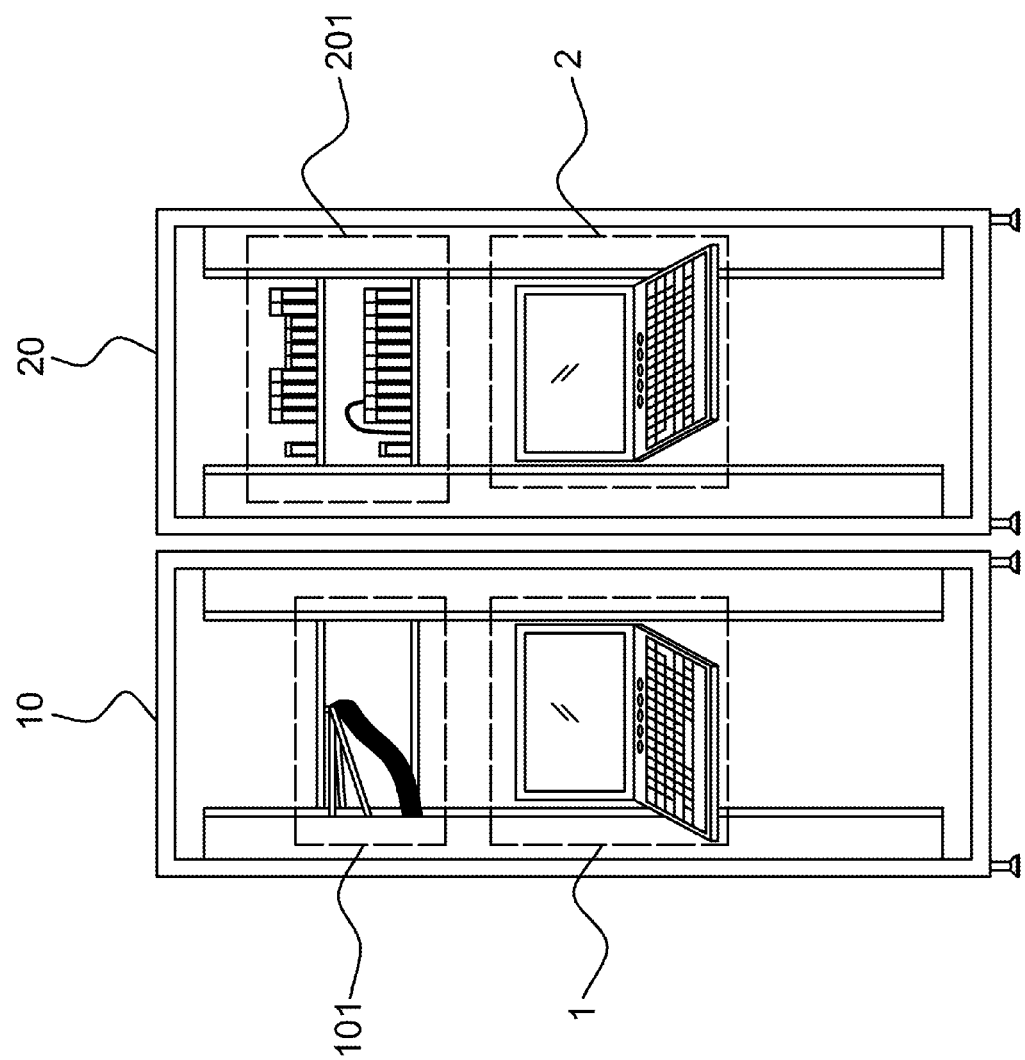
FIG. 2 is a view showing the hardware architecture.

Please refer to FIG. 2, which is a view showing a hardware architecture. As shown in the figure, a hardware architecture according to the present invention comprises a safety control system simulator cabinet 10 and an enhanced nuclear power plant simulator cabinet 20.

The safety control system simulator cabinet 10 is an industrial personal computer platform having the first hardware I/O interface 101, where the safety control system simulator 1 has safety control logics developed through an intuitive graphic programming language; and the first hardware I/O interface 101 is a data acquisition card, a chassis or a control card.

The enhanced nuclear power plant simulator cabinet 20 is an industrial personal computer platform having the second hardware I/O interface 201, where the second hardware I/O interface 201 of the enhanced nuclear power plant simulator 2 is an industrial hardware I/O interface to communicate with the enhanced nuclear power plant simulator software 21 (shown in FIG. 1) through Transmission Control Protocol and Internet Protocol (TCP/IP). Thus, the safety control system simulator 1 and the enhanced nuclear power plant simulator 2 communicate through the first and the second hardware I/O interfaces 101,201.

Hence, parameters of the enhanced nuclear power plant simulator 2 and responses of control of the safety control system simulator 1 are mutually transferred between the first hardware I/O interface 101 of the safety control system simulator 1 and the second hardware I/O interface 201 of the enhanced nuclear power plant simulator 2 through hardwired connections at backplanes.

Figure 3:
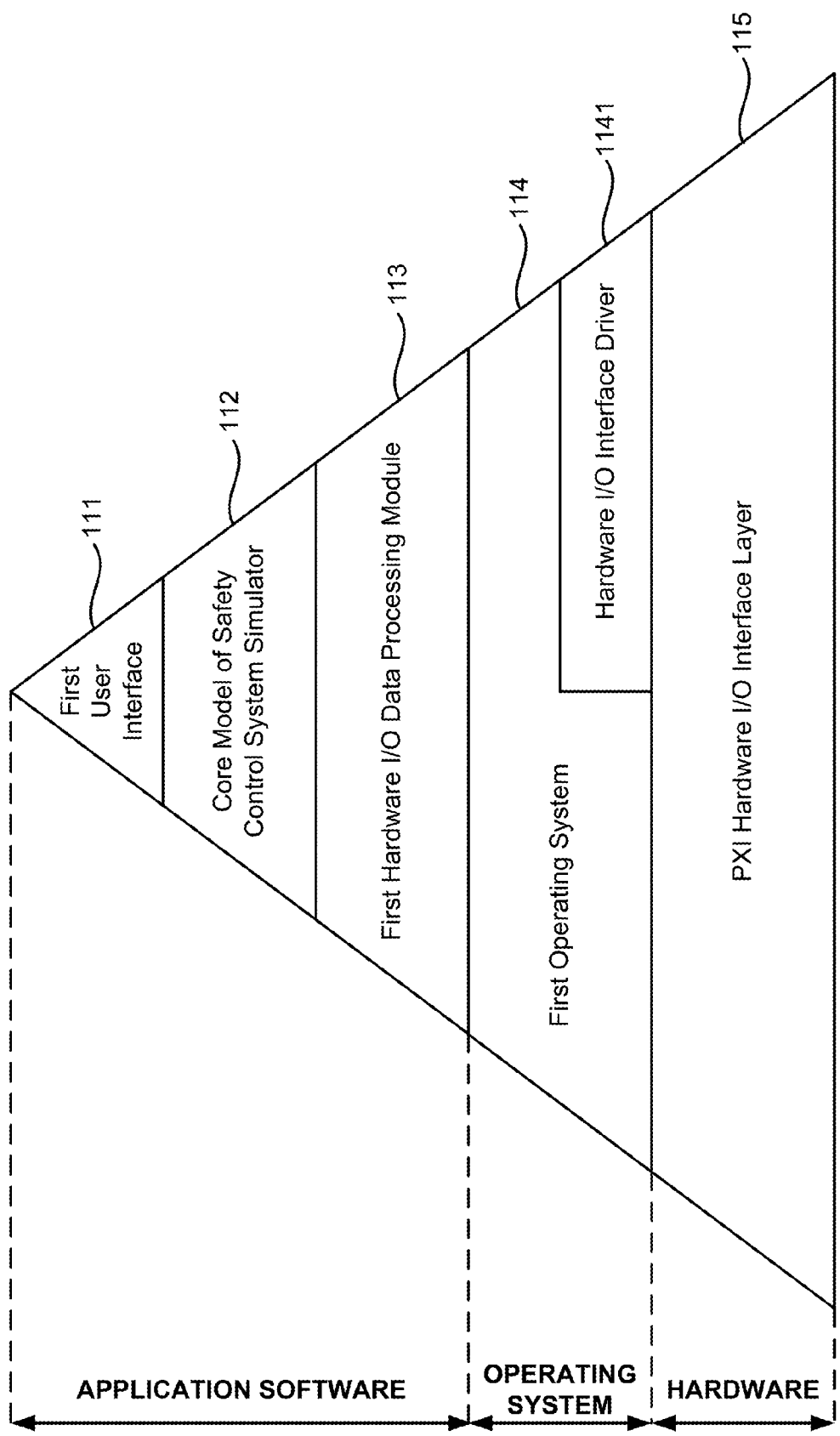
FIG. 3 is a view showing the software architecture of the safety control system simulator.

Please refer to FIG. 3, which is a view showing a software architecture of the safety control system simulator 1. As shown in the figure, a software architecture of the safety control system simulator 1 comprises a first user interface layer 111, a safety control system simulator core model 112, a first hardware I/O data processing module 113, a first operating system 114 and a Peripheral Component Interconnect (PCI) eXtensions for Instrumentation (PXI) hardware I/O interface layer 115.

The first user interface layer 111 provides manual operation of the safety control system simulator 1; and shows parameters of the enhanced nuclear power plant simulator 2 and states of the safety control system simulator 1 under automatic control.

The safety control system simulator core model 112 is a core program of the safety control system simulator 1 configured to simulate control logics of the safety control system simulator 1; receive parameters of the enhanced nuclear power plant simulator 2 through the first hardware I/O data processing module 113, like water level signals and pressure signals, etc.; and obtain control commands through logical calculation with the parameters to control facilities in the enhanced nuclear power plant simulator 2.

The first hardware I/O data processing module 113 converts electrical data obtained from the PXI hardware I/O interface layer 115 into industrial sums to judge correctness of signals and provides warning to the safety control system simulator core model 112.

The first operating system 114 has a hardware I/O interface driver 1141 and is a module executing the safety control system simulator core model 112 to read data required for the first hardware I/O data processing module 113 through the hardware I/O interface driver 1141 or to write data to the PXI hardware I/O interface layer 115, immediately.

The PXI hardware I/O interface layer 115 is composed of a power supply and a hardware I/O interface conformed to industry PXI standards to process analog and digital signals; is connected with the first operating system 114 through signals in an optical fiber; and is connected with the enhanced nuclear power plant simulator 2 through physical wires.

Figure 4:
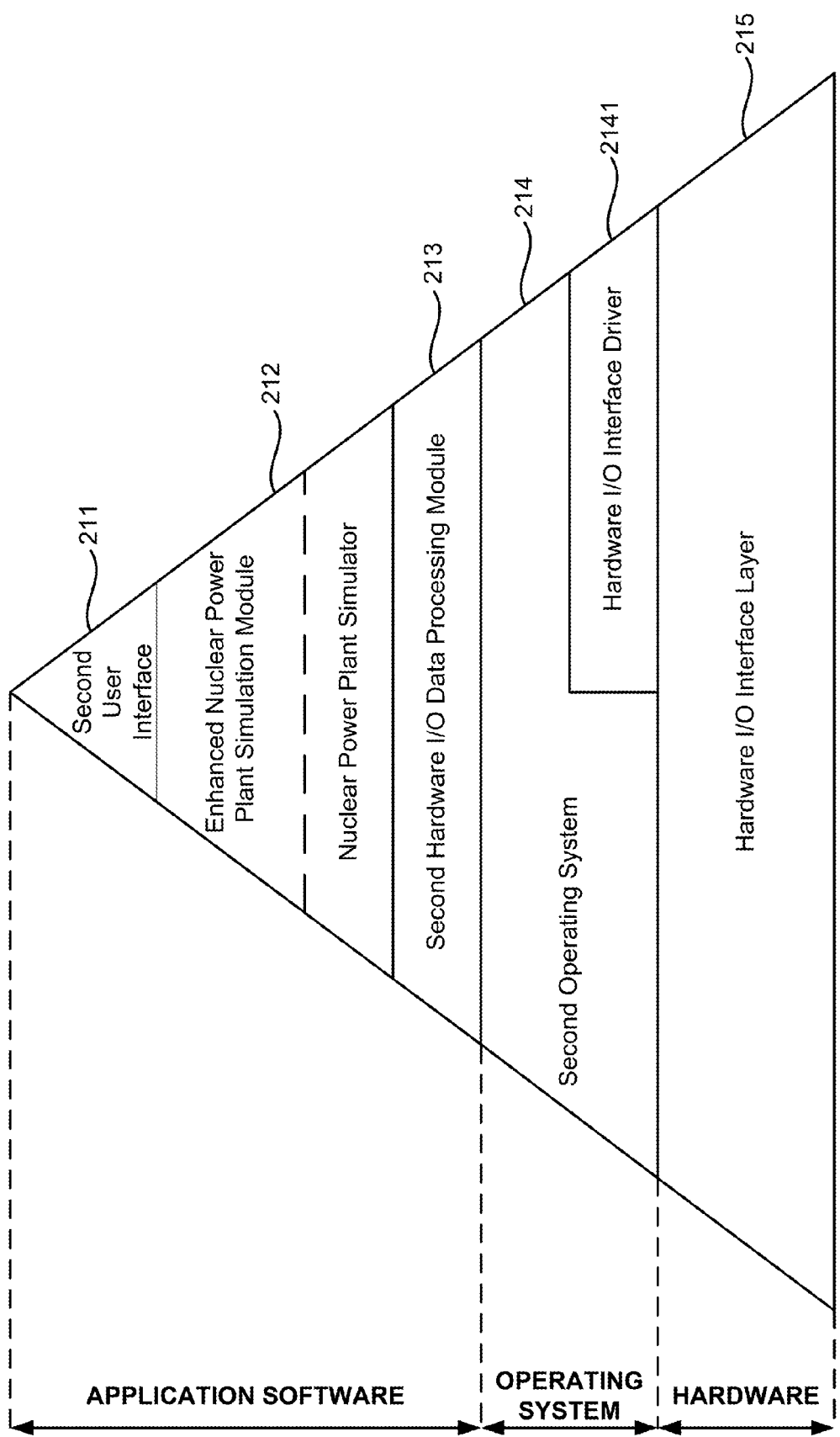
FIG. 4 is a view showing the software architecture of the enhanced nuclear power plant simulator.

Please refer to FIG. 4, which is a view showing a software architecture of the enhanced nuclear power plant simulator 2. As shown in the figure, a software architecture of the enhanced nuclear power plant simulator 2 comprises a second user interface layer 211, an enhanced nuclear power plant simulation module 212, a second hardware I/O data processing module 213, a second operating system 214 and a hardware I/O interface layer 215.

The second user interface layer 211 provides manual operation of the enhanced nuclear power plant simulator 2; and shows parameters of the enhanced nuclear power plant simulator 2 and states of control of the safety control system simulator 1.

The enhanced nuclear power plant simulation module 212 is a core program of the enhanced nuclear power plant simulator 2 for simulating facilities of an enhanced nuclear power plant; and receives control commands of the safety control system simulator 1 through the second hardware I/O data processing module 213 to control the simulated enhanced nuclear power plant with parameters of the enhanced nuclear power plant simulator 2 and reactions of the facilities. Therein, the facilities include all kinds of pumps, gates, motors and safety facilities; and the reactions include reactions of a core and calculations of pressures, flows and temperatures.

The second hardware I/O data processing module 213 converts electrical data obtained from the hardware I/O interface layer 215 into industrial sums to judge correctness of signals and provides warning to the enhanced nuclear power plant simulation module 212.

The second operating system 214 has a second hardware I/O interface driver 2141 and is a module executing the enhanced nuclear power plant simulator 2 to read data from the second hardware I/O data processing module 213 through the second hardware I/O interface driver 2141 or to write data to the hardware I/O interface layer 215, immediately.

The hardware I/O interface layer 215 is an industrial programmable logic controller (PLC), comprising a central processing unit (CPU), a power supply and an analog/digital signal I/O module; is connected with the second operating system 214 through an Ethernet network; and is connected with the safety control system simulator 1 through physical wires.

Figure 5:
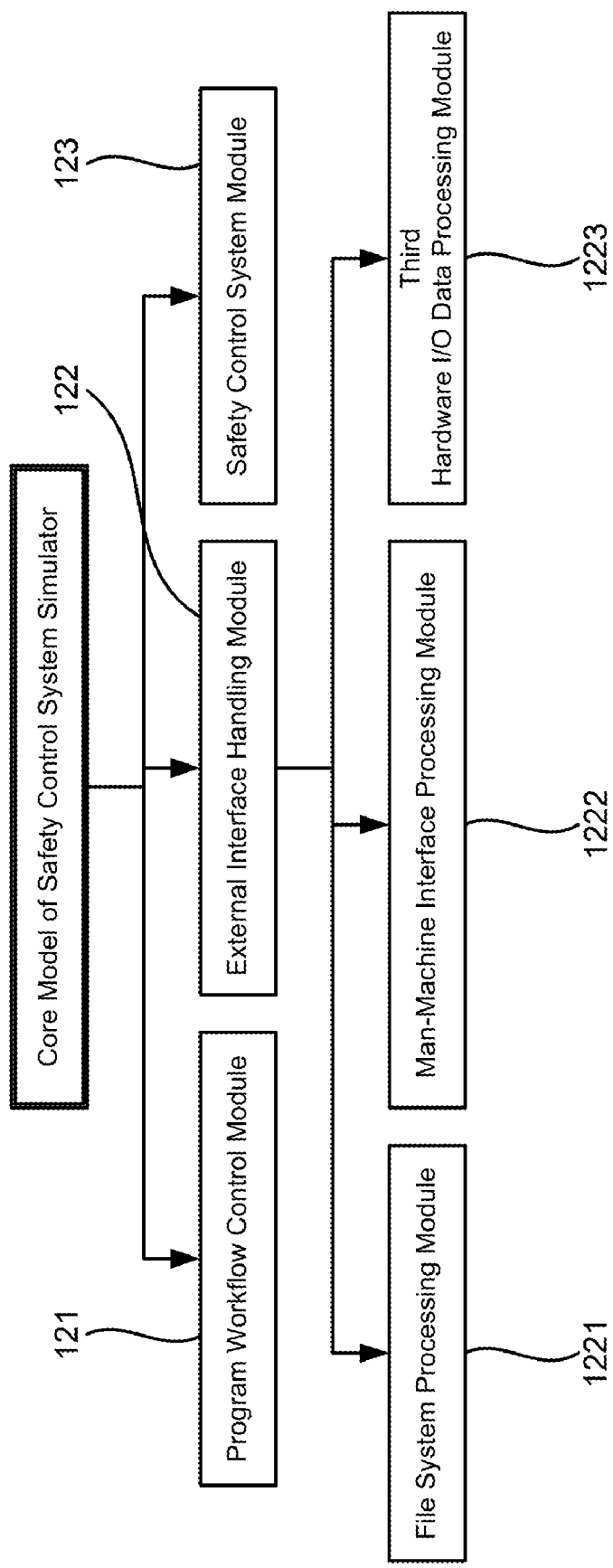
FIG. 5 is a view showing the kernel architecture of the safety control system simulator.

Please refer to FIG. 5, which is a view showing a kernel architecture of the safety control system simulator 1. As shown in the figure, a kernel architecture of the safety control system simulator 1 comprises a program workflow control module 121, an external interface processing module 122 and a safety control system module 123.

The program workflow control module 121 loads initial conditions from a file system and, after initializing all parameters, controls a whole simulation flow, including simulation start and simulation stop. At the same time, the program workflow control module 121 coordinates data communication and controls work flow between the external interface handling module 122 and the safety control system module 123.

The external interface handling module 122 comprises a file system processing module 1221, a first man-machine interface processing module 1222 and a third hardware I/O data processing module 1223, where the file system processing module 1221 accesses data of an external file system, loads the initial conditions and initializes the parameters. The first man-machine interface processing module 1222 receives and processes parameters and commands from an external user interface and provides parameters of a power plant on the external user interface. The third hardware I/O data processing module 1223 receives and sets analog and digital signals of the enhanced nuclear power plant simulator 2 from an external hardware interface through the first and the second hardware I/O data processing module 113,213 (shown in FIG. 3 and FIG. 4).

The safety control system module 123 is a core module of the safety control system simulator 1 to simulate control logics of a safety control system, comprising basic logic control, logic control of qualified OR gate with 2 inputs ON (QOR2), linear control, Proportional/Integral/Derivative (PID) control, and trip control of safety signal. The safety control system module 123 receives parameters of the enhanced nuclear power plant simulator 2 through the third hardware I/O data processing module 1223 to produce corresponding control signals for facilities. At last, the control signals are transferred to the enhanced nuclear power plant simulator 2 through the third hardware I/O data processing module 1223 to control the facilities.

Figure 6:
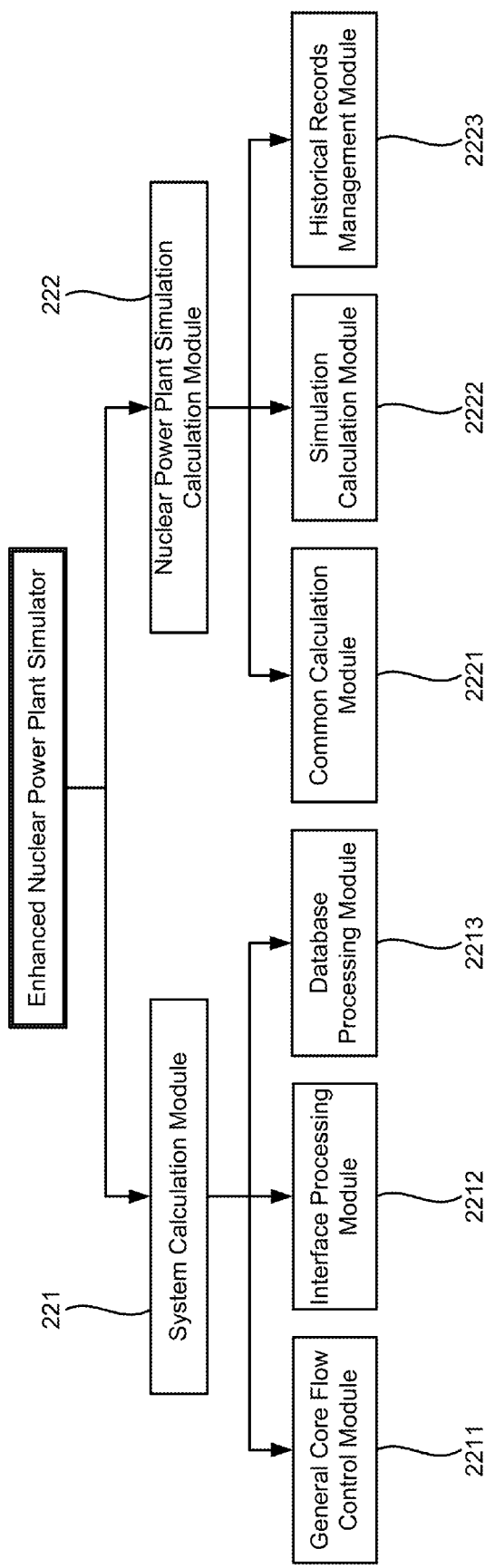
FIG. 6 is a view showing the kernel architecture of the enhanced nuclear power plant simulator.

Please refer to FIG. 6, which is a view showing a kernel architecture of the enhanced nuclear power plant simulator 2. As shown in the figure, a kernel architecture of the enhanced nuclear power plant simulator 2 comprises a system calculation module 221 and a nuclear power plant simulation calculation module 222.

The system calculation module comprises a general core flow control module 2211, an interface processing module 2212 and a database processing module 2213.

The general core flow control module 2211 processes calculations on starting and calculations on running simulation. After starting the system, parameters of a power plant are loaded from database to process initial calculations with the parameters; and, then, basic calculations, including version declaration of a user interface, are processed. At this moment, commands and situations are inputted with control authority transferred to the nuclear power plant simulation calculation module 222 for simulation thereafter.

The interface processing module 2212 comprises a second man-machine interface processing module and a fourth hardware I/O data processing module, where the second man-machine interface processing module receives and processes parameters and commands from an external user interface and shows the parameters and results on a man-machine interface. The fourth hardware I/O data processing module converts electrical data obtained from a PLC into industrial sums to judge correctness of signals and provides warning to the enhanced nuclear power plant simulator.

The database processing module 2213 accesses databases, where initial conditions are loaded before simulations; parameters and dose amounts are dynamically recorded during simulation; and a plot database and a malfunction database are accessed.

The nuclear power plant simulation calculation module 222 comprises a common calculation module 2221, a simulation calculation module 2222 and a historical records management module 2223. The nuclear power plant simulation calculation module 222 processes a cycle of simulation in 0.5 seconds; then, after the simulation, control authority is transferred to the historical records management module 2223. Therein, the common calculation module 2221 comprises parameter declarations and theoretical model functions of the enhanced nuclear power plant simulator; and the theoretical model functions comprise Moody chart functions, Euler equations, decay heat curve functions and interpolation functions.

The simulation calculation module 2222 comprises processes of initializing parameters of the enhanced nuclear power plant simulator 2 and processing simulation functions of the enhanced nuclear power plant simulator 2. Besides, the simulation calculation module 2222 controls a simulation flow of the enhanced nuclear power plant simulator 2 by controlling control rods, a core, a spray system, containment, an emergency cooling system and a plurality of pumps.

The historical records management module 2223 simultaneously renews and shows parameters of a power plant on a user interface layer; and records the parameters of the power plant through the database processing module 2213.

Thus, a diversity and defense-in-depth simulation apparatus is obtained according to the present invention, which provides a simulation platform for evaluating problems in a digital instrument and control system, including software common mode failure, interaction errors between an operator and an interface of the digital instrument and control system and complexity of a software fault. Hence, interaction errors between an operator and an interface of the digital instrument and control system can be estimated to find new fault modes and to deduce scenarios. A method for finding weakness of a safety control system can be thus developed to evaluate a design of a diversity and defense-in-depth system for improving safety of a nuclear power plant.

To sum up, the present invention is a diversity and defense-in-depth simulation apparatus, where a simulation platform is provided for evaluating problems in a digital instrument and control system and interaction errors between an operator and an interface of the digital instrument and control system; and thus new fault modes can be found and scenarios can be deduced to develop methods for finding weakness of a safety control system and further for evaluating a design of a diversity and defense-in-depth system to improve safety of a nuclear power plant The preferred embodiment herein disclosed is not intended to unnecessarily limit the scope of the invention. Therefore, simple modifications or variations belonging to the equivalent of the scope of the claims and the instructions disclosed herein for a patent are all within the scope of the present invention.

What is claimed is:

1. A diversity and defense-in-depth simulation apparatus, comprising
   (a) a safety control system simulator, comprising
      (a1) a hardware architecture, said hardware architecture being an industrial personal computer in a cabinet of said safety control system simulator, said hardware architecture having a first hardware input/output (I/O) interface;
      (a2) a software architecture, comprising
         (a21) a first user interface layer;
         (a22) a safety control system simulator core model;
         (a23) a first hardware I/O data processing module;

(a24) a first operating system; and
(a25) a Peripheral Component Interconnect (PCI) eXtensions for Instrumentation (PXI) hardware I/O interface layer; and
(a3) a kernel architecture, comprising
(a31) a program workflow control module;
(a32) an external interface processing module; and
(a33) a safety control system module; and
(b) an enhanced nuclear power plant simulator, comprising
(b1) a hardware architecture, said hardware architecture being an industrial personal computer in a cabinet of said enhanced nuclear power plant simulator, said hardware architecture having a second hardware I/O interface;
(b2) a software architecture, comprising
(b21) a second user interface layer;
(b22) an enhanced nuclear power plant simulation module;
(b23) a second hardware I/O data processing module;
(b24) a second operating system; and
(b25) a hardware I/O interface layer; and
(b3) a kernel architecture, comprising
(b31) a system calculation module; and
(b32) a nuclear power plant simulation calculation module,
wherein said safety control system simulator provides manual operation, shows information and simulates behaviors of said safety control system module; said safety control system simulator receives parameters of said enhanced nuclear power plant simulator through said first hardware I/O interface to respond with corresponding control signals according to control logics of said safety control system module; and said safety control system simulator transfers said control signals to said enhanced nuclear power plant simulator through said first hardware I/O interface;
wherein said enhanced nuclear power plant simulator receives said control signals of said safety control system simulator and sends responses of the enhanced nuclear power plant simulator through said second hardware I/O interface; and said enhanced nuclear power plant simulator provides analysis of diversity and defense-in-depth communicates between said enhanced nuclear power plant simulator and said first hardware I/O interface of said safety control system simulator; and
wherein parameters of said enhanced nuclear power plant simulator and control responses of said safety control system simulator are mutually transferred through hard-wired connections at backplanes wherein said safety control system module is a core module of said safety control system simulator and executes control logics of said safety control system module and controls facilities of said enhanced nuclear power plant simulator to be simulated and wherein said control logics of said safety control system module comprise basic logic control, logic control of qualified OR gate with 2 inputs ON (QOR2), linear control, Proportional/Integral/Derivative (PID) control, and trip control of safety signal.

2. The apparatus according to claim 1, wherein said first hardware I/O interface of said safety control system simulator is a PXI hardware interface device; and wherein said first hardware I/O interface is selected from a group consisting of a data acquisition card, a chassis and a control card.

3. The apparatus according to claim 1, wherein said second hardware I/O interface of said enhanced nuclear power plant simulator is an industrial hardware I/O interface module which communicates with said nuclear power plant simulator through Transmission Control Protocol and Internet Protocol (TCP/IP).

4. The apparatus according to claim 1, wherein said first hardware I/O interface of said safety control system simulator and said second hardware I/O interface of said enhanced nuclear power plant simulator have hard-wired connections through said backplane.

5. The apparatus according to claim 1,
wherein said first user interface layer provides manual operation of said safety control system simulator and shows parameters of said enhanced nuclear power plant simulator and states of said safety control system simulator under automatic control;
wherein said safety control system simulator core model is a core program of said safety control system simulator to simulate said control logics of said safety control system module; said safety control system simulator core model receives parameters of said enhanced nuclear power plant simulator through said first hardware I/O data processing module; and said safety control system simulator core model obtains control commands through logical calculation with said parameters to control facilities in said enhanced nuclear power plant simulator;
wherein said first hardware I/O data processing module converts electrical data obtained from said PXI hardware I/O interface layer into industrial sums to judge correctness of signals and provides warning to said safety control system simulator core model;
wherein said first operating system is a module executing said safety control system simulator core model to immediately operate a process selected from a group consisting of reading data from said first hardware I/O data processing module and writing data to said PXI hardware I/O interface layer; and
wherein said PXI hardware I/O interface layer is composed of a power supply and a hardware I/O interface conformed to industrial PXI standards to process analog and digital signals; and said PXI hardware I/O interface layer is connected with said first operating system through signals in an optical fiber and is connected with said enhanced nuclear power plant simulator through physical wires.

6. The apparatus according to claim 5, wherein said first operating system has a first hardware I/O interface driver.

7. The apparatus according to claim 1,
wherein said second user interface layer provides manual operation of said enhanced nuclear power plant simulator and shows parameters of said enhanced nuclear power plant simulator and states of control of said safety control system simulator;
wherein said enhanced nuclear power plant simulation module is a core program of said enhanced nuclear power plant simulator to simulate facilities of a safety system and reactions of said power plant; said enhanced nuclear power plant simulation module receives control commands of said safety control system simulator through said second hardware I/O data processing module to control said enhanced nuclear power plant simulator with parameters of said enhanced nuclear power plant simulator and reactions of said facilities;
wherein said second hardware I/O data processing module converts electrical data obtained from said hardware I/O interface layer into industrial sums to judge correctness of signals and provides warning to said enhanced nuclear power plant simulation module;

wherein said second operating system is a module executing said enhanced nuclear power plant simulator to immediately operate a process selected from a group consisting of reading data from said second hardware I/O data processing module and writing data to said hardware I/O interface layer; and wherein said hardware I/O interface layer is an industrial programmable logic controller (PLC), comprising a central processing unit (CPU), a power supply and an analog/digital signal I/O module; said hardware I/O interface layer is connected with said second operating system through an Ethernet network; and said hardware I/O interface layer is connected with said safety control system simulator through physical wires.

8. The apparatus according to claim 7, wherein said second operating system has a second hardware I/O interface driver.

9. The apparatus according to claim 1, wherein said program workflow control module controls a whole simulation flow and coordinates data communication and flow control between said external interface handling module and said safety control system module.

10. The apparatus according to claim 9, wherein said simulation flow includes simulation start and simulation stop.

11. The apparatus according to claim 1,
wherein said external interface handling module comprises
(i) a file system processing module, said file system processing module accessing data of an external file system, loading initial conditions and initializing parameters;
(ii) a first man-machine interface processing module, said man-machine interface processing module receiving and processing parameters and commands from an external user interface and providing parameters of said power plant on said external user interface; and
(iii) a third hardware I/O data processing module, said third hardware I/O data processing module receiving and setting analog and digital signals of said enhanced nuclear power plant simulator from an external hardware interface through said first hardware I/O data processing module and said second hardware I/O data processing module.

12. The apparatus according to claim 1,
wherein said system calculation module comprises
(i) a general core flow control module, wherein, after starting the system, parameters of said power plant is loaded from database to process initial calculations and then basic calculations of user interfaces; and commands and situations are inputted with control authority transferred to said nuclear power plant simulation calculation module thereafter;
(ii) an interface processing module, comprising
(x1) a second man-machine interface processing module, said second man-machine interface processing module receiving and processing parameters and commands from an external user interface; and
(x2) a fourth hardware I/O data processing module, said fourth hardware I/O data processing module converting electrical data obtained from a PLC into industrial sums to judge correctness of signals, said fourth hardware I/O data processing module providing warning to said enhanced nuclear power plant simulator; and
(iii) a database processing module, said database processing module accessing databases, wherein initial conditions are loaded before simulations; parameters and dose amounts are dynamically recorded during simulations; and a plot database and a malfunction database are accessed.

13. The apparatus according to claim 1,
wherein said nuclear power plant simulation calculation module comprises
(i) a common calculation module, said common calculation module comprising parameter declarations and theoretical model functions of said enhanced nuclear power plant simulator;
(ii) a simulation calculation module, said simulation calculation module comprising parameter initializations and main functions of said enhanced nuclear power plant simulator; and
(iii) a historical records management module, said historical records management module simultaneously renewing and showing parameters of said power plant on said second user interface layer and recording said parameters of said power plant through said database processing module of said system calculation module.

14. The apparatus according to claim 13, wherein said nuclear power plant simulation calculation module processes a cycle of simulation in 0.5 seconds and then control authority is transferred to said historical records management module.

15. The apparatus according to claim 13, wherein said theoretical model functions comprise Moody chart functions, Euler equations, decay heat curve functions and interpolation functions.

16. The apparatus according to claim 13, wherein said simulation calculation module controls a simulation flow of said enhanced nuclear power plant simulator by controlling control rods, a core, a spray system, containment, an emergency cooling system and a plurality of pumps.

17. The apparatus according to claim 1, wherein said safety control system simulator has safety control logics developed through an intuitive graphic programming language.

18. A diversity and defense-in-depth simulation apparatus, comprising
(a) a safety control system simulator, comprising
(a1) a hardware architecture, said hardware architecture being an industrial personal computer in a cabinet of said safety control system simulator, said hardware architecture having a first hardware input/output (I/O) interface;
(a2) a software architecture, comprising
(a21) a first user interface layer;
(a22) a safety control system simulator core model;
(a23) a first hardware I/O data processing module;
(a24) a first operating system; and
(a25) a Peripheral Component Interconnect (PCI) eXtensions for Instrumentation (PXI) hardware I/O interface layer; and
(a3) a kernel architecture, comprising
(a31) a program workflow control module;
(a32) an external interface processing module; and
(a33) a safety control system module; and
(b) an enhanced nuclear power plant simulator, comprising
(b1) a hardware architecture, said hardware architecture being an industrial personal computer in a cabinet of said enhanced nuclear power plant simulator, said hardware architecture having a second hardware I/O interface;
(b2) a software architecture, comprising
(b21) a second user interface layer;
(b22) an enhanced nuclear power plant simulation module;

(b23) a second hardware I/O data processing module;
(b24) a second operating system; and
(b25) a hardware I/O interface layer; and
(b3) a kernel architecture, comprising
(b31) a system calculation module; and
(b32) a nuclear power plant simulation calculation module comprising:
(i) a common calculation module, said common calculation module comprising parameter declarations and theoretical model functions of said enhanced nuclear power plant simulator, wherein said theoretical model functions comprise Moody chart functions, Euler equations, decay heat curve functions and interpolation functions;
(ii) a simulation calculation module, said simulation calculation module comprising parameter initializations and main functions of said enhanced nuclear power plant simulator; and
(iii) a historical records management module, said historical records management module simultaneously renewing and showing parameters of said power plant on said second user interface layer and recording said parameters of said power plant through said database processing module of said system calculation module and wherein said safety control system simulator provides manual operation, shows information and simulates behaviors of said safety control system module; said safety control system simulator receives parameters of said enhanced nuclear power plant simulator through said first hardware I/O interface to respond with corresponding control signals according to control logics of said safety control system module; and said safety control system simulator transfers said control signals to said enhanced nuclear power plant simulator through said first hardware I/O interface;

wherein said enhanced nuclear power plant simulator receives said control signals of said safety control system simulator and sends responses of the enhanced nuclear power plant simulator through said second hardware I/O interface; and said enhanced nuclear power plant simulator provides analysis of diversity and defense-in-depth communicates between said enhanced nuclear power plant simulator and said first hardware I/O interface of said safety control system simulator; and wherein parameters of said enhanced nuclear power plant simulator and control responses of said safety control system simulator are mutually transferred through hardwired connections at backplanes.

\* \* \* \* \*